(12) United States Patent
Palanisamy et al.

(10) Patent No.: US 6,455,930 B1
(45) Date of Patent: Sep. 24, 2002

(54) INTEGRATED HEAT SINKING PACKAGES USING LOW TEMPERATURE CO-FIRED CERAMIC METAL CIRCUIT BOARD TECHNOLOGY

(75) Inventors: Ponnuswamy Palanisamy, Landsdale, PA (US); Attiganal Narayanaswamy Sreeram, Edison, NJ (US); Ellen Schwartz Tormey, Princeton Jct., NJ (US); Barry Jay Thaler, Lawrenceville, NJ (US); John Connolly, Clarksburg, NJ (US); Ramon Ubaldo Martinelli, Hightstown, NJ (US); Ashok Narayan Prabhu, East Windsor, NJ (US); Mark Stuart Hammond, Pennington, NJ (US)

(73) Assignee: Lamina Ceramics, Inc., West Ampton, NJ (US)

( * ) Notice: Subject to any disclaimer, the term of this patent is extended or adjusted under 35 U.S.C. 154(b) by 0 days.

(21) Appl. No.: 09/664,599

(22) Filed: Sep. 18, 2000

Related U.S. Application Data

(60) Provisional application No. 60/170,417, filed on Dec. 13, 1999, provisional application No. 60/206,519, filed on May 22, 2000, provisional application No. 60/206,170, filed on May 22, 2000, and provisional application No. 60/213,098, filed on Jun. 21, 2000.

(51) Int. Cl.[7] ............................................. H01L 23/34
(52) U.S. Cl. .................... 257/706; 257/707; 257/712; 257/713; 257/717; 257/720; 257/724; 174/252; 361/702; 361/703; 361/704; 361/709; 361/711
(58) Field of Search ................................ 257/706, 707, 257/710, 712, 717, 720, 723, 724, 668, 700, 701, 703, 713, 738, 758, 778; 174/52.4, 252; 361/702, 704, 709, 711, 712, 719, 703; 438/121, 122

(56) References Cited

U.S. PATENT DOCUMENTS

| 4,615,031 A | * | 9/1986 | Eales et al. ................... 372/36 |
| 4,748,085 A | * | 5/1988 | Fukuda et al. ............... 428/432 |
| 4,821,151 A | * | 4/1989 | Pryor et al. .................. 361/403 |
| 5,237,434 A | * | 8/1993 | Feldman et al. ............... 359/19 |
| 5,256,469 A | | 10/1993 | Cherukuri et al. .......... 428/210 |
| 5,386,339 A | * | 1/1995 | Polinski, Sr. ................ 361/719 |
| 5,565,262 A | | 10/1996 | Azzaro et al. ............... 428/210 |
| 5,581,876 A | | 12/1996 | Prabhu et al. .................. 29/851 |
| 5,615,224 A | * | 3/1997 | Cohen .......................... 372/36 |
| 5,638,391 A | * | 6/1997 | Shima et al. ................... 372/44 |
| 5,725,808 A | | 3/1998 | Tormey et al. ............. 252/514 |
| 5,939,778 A | * | 8/1999 | Boutin et al. ................ 257/678 |
| 5,949,654 A | * | 9/1999 | Fukuoka ...................... 361/760 |
| 5,977,567 A | * | 11/1999 | Verdiell ........................ 257/99 |
| 6,017,642 A | | 1/2000 | Kumar et al. ................ 428/630 |
| 6,023,413 A | * | 2/2000 | Umezawa ..................... 361/697 |
| 6,055,151 A | * | 4/2000 | Tormey et al. ............. 361/313 |
| 6,097,857 A | * | 8/2000 | Feldman ........................ 385/14 |
| 6,146,025 A | * | 11/2000 | Abbink et al. ................. 385/88 |
| 6,172,416 B1 | * | 1/2001 | Miyahara et al. ........... 257/712 |

FOREIGN PATENT DOCUMENTS

JP        6-244307    *   2/1994

* cited by examiner

*Primary Examiner*—David L. Talbott
*Assistant Examiner*—Alonzo Chambliss
(74) *Attorney, Agent, or Firm*—Lowenstein Sandler PC

(57) ABSTRACT

Integrated packages incorporating multilayer ceramic circuit boards mounted on a metal support substrate can be used for temperature control by the metal support substrate. Various electronic components, as well as additional temperature control devices, can be connected to the circuit boards and to the metal support substrate to control or regulate the temperature of operation of the components. The integrated package can be hermetically sealed with a lid.

8 Claims, 2 Drawing Sheets

INTEGRATED HEAT SINKING PACKAGES USING LOW TEMPERATURE CO-FIRED CERAMIC METAL CIRCUIT BOARD TECHNOLOGY

This application claims the benefit of U.S. Provisional Applications Serial No. 60/170,417 filed Dec. 13, 1999, Serial No. 60/206,519 filed May 22, 2000, Serial No. 60/206,170 filed May 22, 2000, and Serial No. 60/213,098 filed Jun. 21, 2000.

This invention relates to improved integrated packages that permit temperature control of devices mounted in or on the packages using multilayer ceramic circuit board technology. More particularly, this invention relates to integrated packages using low temperature co-fired ceramic on metal (LTCC-M) support boards that have high thermal conductivity useful for temperature control of devices mounted on the metal support.

BACKGROUND OF THE INVENTION

Multilayer ceramic circuit boards are well known. A green tape is made from particular glass compositions and optional ceramic powders, which are mixed with organic binders and a solvent, cast and cut to form green tapes. Wiring patterns can be screen printed onto the tape layers to carry out various functions. Vias are then punched in the green tapes and are filled with a conductor ink to connect the wiring on one green tape to wiring on another green tape. The tapes are then aligned, laminated, and fired to remove the organic materials, to sinter the metal patterns and to crystallize the glasses. This is generally carried out at temperatures below about 1000° C., and preferably at from about 750–950° C. The composition of the glasses determines the coefficient of thermal expansion, the dielectric constant and the compatibility of the multilayer ceramic circuit boards to various electronic components.

More recently, metal support substrates have been used to support the green tapes. The support boards lend strength to the glass layers, and, since the green tape layers can be mounted on both sides of the metal board, and can be adhered to the metal board with suitable bonding glasses, they permit increased complexity and density of circuits and devices. In addition, passive and active components, such as resistors, inductors, capacitors and the like, can be incorporated into the circuit boards for additional functionality. Thus this system, known as low temperature cofired ceramic-metal support boards, or LTCC-M, has proven to be a means for high integration of various devices and circuitry in a single package. They can also be tailored to be compatible with devices including silicon-based devices, indium phosphide-based devices and gallium arsenide-based devices, for example, by proper choice of the metal for the support board and of the glasses in the green tapes.

The ceramic layers of the LTCC-M structure must be matched to the thermal coefficient of expansion of the metal support board. Glass ceramic compositions are known that match the thermal expansion properties of various metal or metal matrix composites. These compositions are disclosed for example in U.S. Pat. No. 5,625,808 to Tormey et al; U.S. Pat. No. 6,017,642 to Kumar et al; U.S. Pat. No. 5,256,469 to Cherukuri et al; and U.S. Pat. No. 5,565,262 to Azzaro et al. U.S. Pat. No. 5,581,876 to Prabhu et al disclose bonding glasses for adhering ceramic layers to metal support substrates. These references are incorporated herein by reference.

It would be highly desirable to be able to provide an integrated package for all required components on a single metal substrate, to provide adequate and low cost temperature control, and to provide a means for hermetically sealing the integrated package.

SUMMARY OF THE INVENTION

We have found that the LTCC-M system has an additional advantage for integrated package components that run hot. The metal support board can also act as a heat sink, directly or indirectly, for devices such as semiconductor lasers, or for devices that use very dense circuitry.

The conductive metal support substrate provides excellent heat sinking. Thus components that are hot can either be directly mounted onto the metal support board, or can be mounted to conductive vias in a multilayer ceramic circuit board that lead to the metal support board. For more complex integration, the LTCC-M technology can be used to provide additional heat sinking by connecting conventional heat sinks, or thermoelectric coolers, to, or through, the support substrate. The temperature of semiconductor lasers during operation for example must be closely controlled because the wavelength of the emitted light depends on the temperature of the device and its environment.

Another type of device wherein good temperature control is required is for thermal management of flip chip packaging. Densely packed microcircuitry, and devices such as amplifiers, oscillators and the like which generate large amounts of heat, can also use LTCC-M techniques advantageously. The chip prepare for flip chip packaging can be mounted bump side up within a cavity in the ceramic layer and bump bonded to a flex circuit that connects the input/output bumps to metal traces on the top layer of ceramic. Placing the chip on a metal support board provides the cooling required for high integration chips.

DETAILED DESCRIPTION OF THE INVENTION

Figure 1:
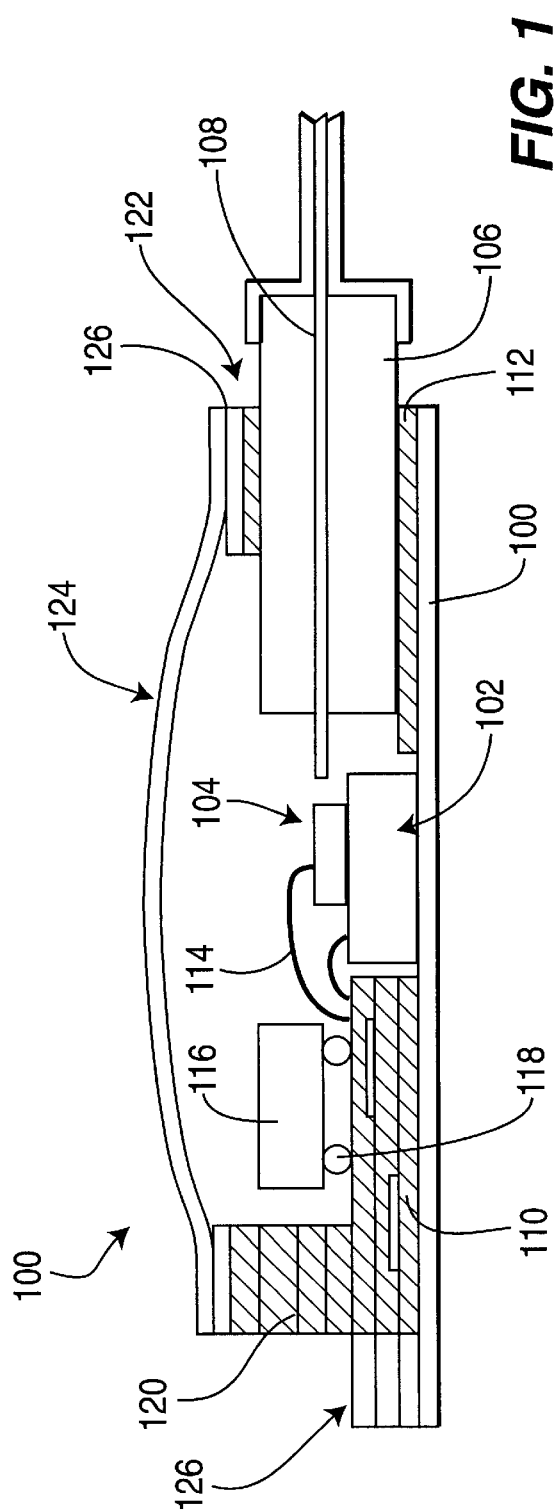
FIG. 1 is a schematic view of an integrated LTCC-M package including a laser device, an optical fiber, a heat spreader and embedded circuitry for driving the laser device.

A bare semiconductor laser die can be mounted directly onto a metal base of the LTCC-M system having high thermal conductivity to cool the laser. In such case, the electrical signals to operate the laser must be connected to the laser from the ceramic. Indirect attachment to the metal support board can also be used.

The metal support boards used for LTCC-M technology do have a high thermal conductivity, but some metal boards have a high thermal coefficient of expansion, and thus a bare die cannot always be directly mounted to such metal support boards. However, some metal support boards are known that can be used for such purposes, such as metal composites of copper and molybdenum (including from 10–25% by weight of copper) or copper and tungsten (including 10–25% by weight of copper), made using powder metallurgical techniques. Copper clad Kovar®, a metal alloy of iron, nickel, cobalt and manganese, a trademark of Carpenter Technology, is a very useful support board. AlSiC is another material that can be used for direct attachment, as can aluminum or copper graphite composites.

However, in order to provide closer control of the temperature of a laser during operation to control the wavelength of the light emitted by the laser, conventional thermoelectric coolers can be used together with a metal support substrate. The laser is connected to an optical fiber which requires alignment components, such as optical isolators, and the laser must be mounted, directly or indirectly, on the metal support board. An optical detector is also required, as well as electrical leads connecting all of these components for an integrated package.

Another instance wherein good cooling is required is for thermal management of flip chip packaging. Densely packed microcircuitry, and devices such as amplifiers, oscillators and the like which generate large amounts of heat, can also use LTCC-M techniques advantageously. Metallization on the top layers of an integrated circuit bring input/output lines to the edge of the chip so as to be able to wire bond to the package or module that contains the chip. Thus the length of the wirebond wire becomes an issue; too long a wire leads to parasitics; the cost of very high integration chips may be determined by the arrangement of the bond pads, rather than by the area of silicon needed to create the cicuitry. Flip chip packaging overcomes at least some of these problems, using solder bumps rather than wirebond pads to make connections. These solder bumps are smaller than wire bond pads and, when the chip is turned upside down, or flipped, solder reflow can be used to attach the chip to the package. Since the solder bumps are small, the chip can contain input/output connections within its interior if multilayer packaging is used. Thus the chip size will be determined by the number of transistors in it, rather than by the number and size of bond pads.

However, increased density and integration of functions on a single chip leads to higher temperatures on the chip, which may prevent full utilization of optimal circuit density. The only heat sinks are the small solder bumps that connect the chip to the package. If this is insufficient, small active or passive heat sinks must be added on top of the flip chip. Such additional heat sinks increase assembly costs, increase the number of parts required, and increase the package costs. Particularly if the heat sinks have a small thermal mass, they have limited effectiveness as well.

In the simplest form of the present invention, LTCC-M technology is used to provide an integrated package for a semiconductor laser and accompanying circuitry, together with an optical fiber held in a support, wherein the conductive metal support board provides a heat sink for the laser. In this package, all of the required components are mounted on a metal support board, incorporating embedded passive components such as conductors and resistors into the multilayer ceramic portion, to connect the various components, i.e., laser, optical fiber, circuits, heat sink and the like, in an integrated package. By matching the TCE of the ceramic to the optical laser, thermal management is easy and flexible. The package can be hermetically sealed with a lid.

For a more complex structure having improved heat sinking, the integrated package of the invention combines a first and a second LTCC-M substrate. The first substrate has mounted thereon a laser device, an optical fiber, and a multilayer ceramic circuit board with embedded circuitry for operating the laser; the second substrate has a heat sink or conductive heat spreader mounted thereon. Thermoelectric (TEC) plates and temperature control circuitry are mounted between the first and second substrates to provide improved temperature control of laser devices. A hermetic enclosure can be adhered to the metal support board. This integrated package thus provides integrated packaging for operation of a laser and an optical fiber, with extra cooling for improved temperature control.

The use of LTCC-M technology can also utilize the advantages of flip chip packaging together with integrated heat sinking. High power integrated circuits and devices that have high thermal management needs can not be used with the present technology. The packages of the invention can be made smaller, cheaper and more efficient than existing present-day packaging. The metal substrate serves as a heat spreader or heat sink. The flip chip can be mounted directly on the metal substrate, which is an integral part of the package, eliminating the need for additional heat sinking. A flexible circuit can be mounted over the bumps on the flip chip. The use of multilayer ceramic layers can also accomplish a fan-out and routing of traces to the periphery of the package, further improving heat sinking.

The invention will be further described with reference to the Drawing.

The integrated package shown in FIG. 1 illustrates one embodiment of the present invention A thermally conductive metal base 100, as of copper clad molybdenum or Kovar®, has a heat spreader 102 of a thermally conductive material bonded thereto. Conventional die attach methods can be used, such as Au-Sn eutectic. A semiconductor laser 104 is mounted on the heat spreader 102. Depending on the power dissipation and thermal stability requirements of the laser 104, a heat spreader 102 can be chosen from diamond film, copper-tungsten alloy, aluminum nitride and alumina, for example. Depending on the metal base chosen, some of these heat spreaders may be mounted directly on the metal base.

A housing 106 for an optical fiber 108 is mounted on a multilayer ceramic circuit board 112. The circuit board 112 is built up as required so as to maintain alignment between the optical fiber 108 and the semiconductor laser 104. A second ceramic circuit board 110 is mounted on the opposite side of the metal board 100 as the semiconductor laser 104. The laser 104 is connected by means of wire bonds 114 to the ceramic circuitry 110. This second ceramic circuit board 110 includes various drive components and embedded devices according to the functions desired. An IC chip 116 is mounted on the second ceramic circuit board 110 for driving the laser 104. The IC chip 116 is electrically connected to the second multilayer ceramic circuitry 110 by means of solder bumps 118. A third multilayer ceramic board 120 is joined to the second ceramic circuit board 110. A fourth ceramic board 122 is mounted on the edge of the optical fiber housing 106 to support a hermetically sealed lid 124. This lid 124 can be hermetically-sealed by means of seal rings 126 and soldering the lid 124 to the seal rings 126. Additional electrical input/output connections can be made to the second ceramic circuit board 112 as desired.

All of the circuit boards 110, 112 and 120 are fabricated at the same time on a single support board. The integrated device of FIG. 1 further includes a hermetically sealed semiconductor laser, laser driver circuitry, an optical fiber and a heat sink. Additional features can be added as described above. The metal base 100, made of a thermally conductive material, serves to regulate and control the temperature of the package in order to maintain tight tolerances for the light frequency emitted by the laser.

Figure 2:
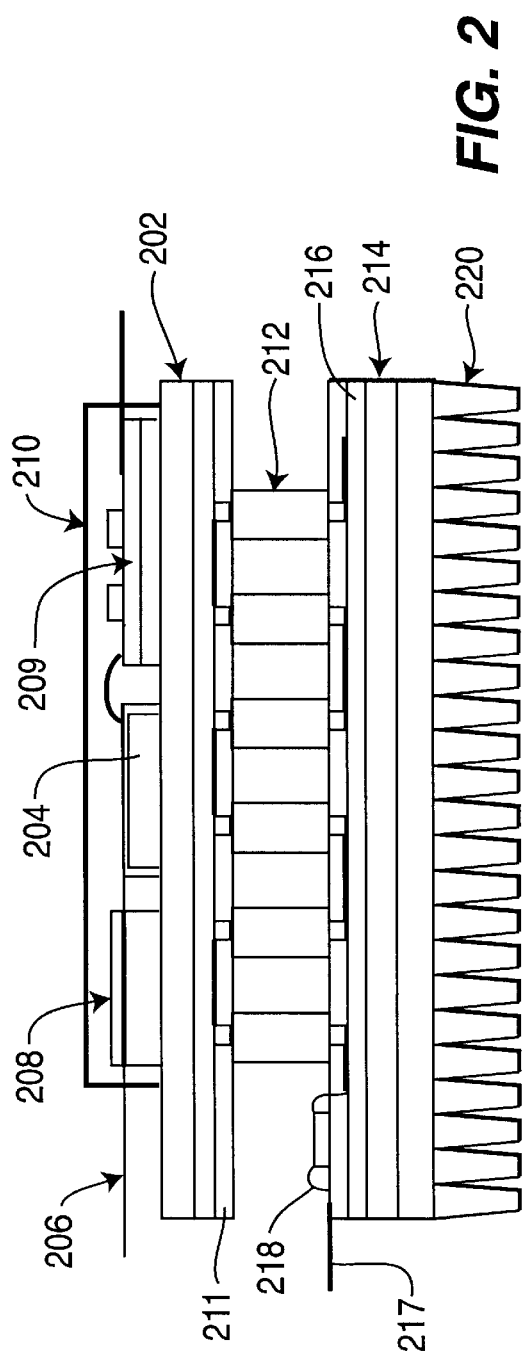
FIG. 2 is a schematic diagram of an integrated LTCC-M TEC/laser package that can be hermetically sealed.

The more complex integrated package shown in FIG. 2 is supported by a metal support substrate 202.

As in the package of FIG. 1, a laser chip 204 is mounted directly on the metal support substrate 202. The copper clad molybdenum support 202 has high thermal conductivity and a good thermal coefficient of expansion (TCE) matched to the indium phosphide or gallium arsenide laser device 204, which thus can be mounted directly thereon. The TCE suitably is about 5.5 ppm/° C. from room temperature to 300° C. which minimizes stresses across the device. An optical fiber 206 is supported on a silicon plate 208 having a V-groove for the fiber therein (not shown). This silicon plate 208 is also mounted on the metal support substrate 202. A multilayer ceramic circuit board 209 is also mounted on the metal support substrate 202. A lid 210, also mounted on the metal support substrate 202, is hermetically sealed thereto. The laser 204 is wire bonded to the multilayer ceramic circuit 209.

On the opposite side of the metal support substrate 202 is a multilayer ceramic circuit board 211 for connecting to a set of thermoelectric plates 212, suitably made from $Bi_2Te_3$, that regulate and control the temperature of the metal support substrate 202, and the laser 204 accordingly. These plates 212 can be soldered to the metal support board. The plates 212 are connected in series with appropriate circuitry in the ceramic circuit boards 211 and 216.

A second metal support substrate 214, also of copper clad molybdenum or Kovar®, has a multilayer ceramic circuit board 216 thereon, also with circuitry to connect the plates 212 in series. This ceramic circuit board 216 also includes power leads 217 and temperature control circuitry 218 thereon, e.g., an embedded resistor, to control the temperature of the thermoelectric plates 212 and to deliver power to the TEC cooler.

On the opposite side of the second metal support substrate 214, is an aluminum or copper heat sink 220 to provide additional heat dissipation.

Other metallizations for mounting additional components onto the fired multilayer ceramic 216 or to the metal base 202 can also be applied. In addition, a groove to support an optical fiber can readily be made in a green tape stack prior to firing instead of forming a groove in the silicon plate 208.

The fiber input port can be hermetically sealed by laser soldering for example, when the input port is designed to accept fibers with metal sleeves; alternatively, thin metal coated fibers can be sealed directly. A coating of a polymer such as parylene can also aid in obtaining hermeticity of the package.

The thermal stability of the ceramic improves system stability and reliability for the integrated package.

Figure 3:
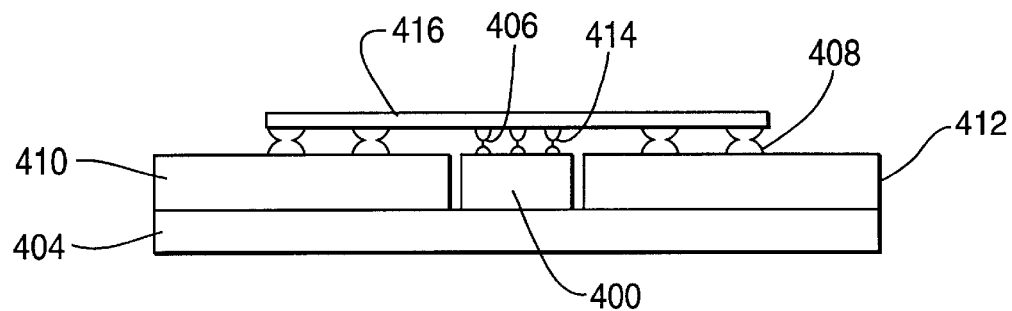
FIG. 3 is a cross sectional view of a flip chip package mounted on an LTCC-M substrate.
Figure 4:
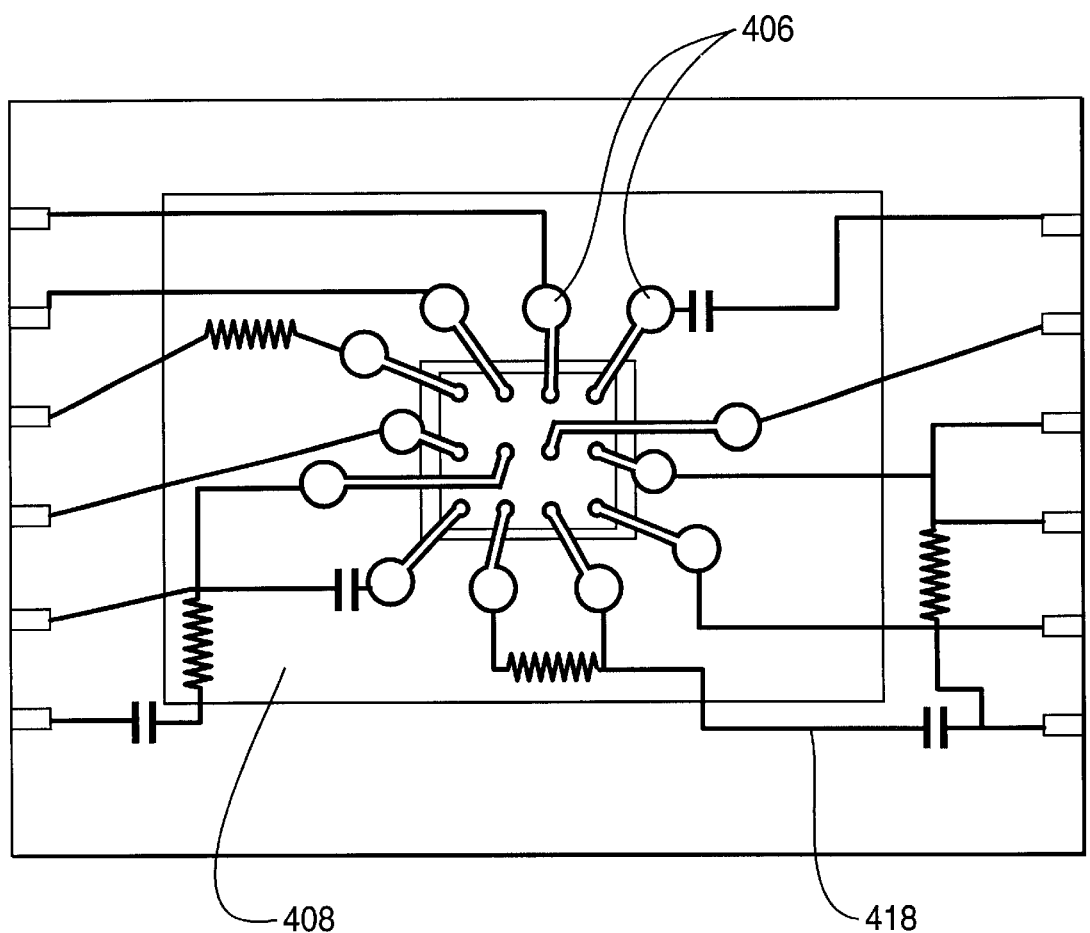
FIG. 4 is a top view of an LTCC-M package with a flip chip bonded integrated circuit connected to the top ceramic layer through an overlying flexible circuit.

A third embodiment of the invention is shown in FIGS. 3 and 4. An integrated circuit 400, which can be a flip chip or ball grid array integrated circuit, is mounted on a metal support substrate 404. An array of solder bumps 406, which replace conventional wire bonding pads for Input/Output (I/O) is added to the integrated circuit 400 upside down, e.g., bump side up. The integrated circuit 400 can be connected to a LTCC-M metal support directly using solder reflow, or connected to conductive vias that lead to the metal support. Ceramic circuits 410, 412 are adhered to the metal support 404 on either side of the integrated circuit 400, and solder bumps 408 adhered to the top of the ceramic surface. The surfaces of the ceramic circuit boards 410 and 412 and the integrated circuit 400 are metallized.

A flexible circuit 416 having the same grid array as the integrated circuit 400 and the ceramic circuits 410, 412, is adhered to the metallization layer. The flexible circuit 416 connects the grid array bonding bumps 414 to fan-out traces on the flexible circuits 416 which in turn connect to the solder bumps 408 on the top ceramic layers.

These features permit the packaged integrated circuit to be directly connected to a large heat sink (the metal support board) that is an integral part of the package, increasing heat spreading and heat removal capacity for the circuit.

FIG. 4 is a top view of this package. The flexible circuit 416 is made transparent so that the underlying metal traces 418 and the ceramic layer 410 and the bonding bumps or array 414 are visible. The center integrated circuit 400 is surrounded with the flexible circuit 416. The metal lines 418 extend to the edge of the package and are shown with dotted lines, as are buried passive components. Solder connections can be made at the edge of the ceramic to attach pins or other connectors between the ceramic board and other elements. The flexibility of the overlayer circuit aids in alignment of the flexible circuit, which can also be multilayered, with underlying integrated circuit and ceramic layers.

Thus again integrated heat sinking of dense circuitry is obtained using the metal layer of the LTCC-M system.

The integrated laser package and the TEC cooler of FIG. 2 as an example can be made by
  a) fabricating a first LTCC-M substrate having the number of ceramic layers and embedded circuitry for operating the laser device and the TEC. A double sided metal support substrate can accommodate interconnect requirements for the laser device on the one side and the TEC on the other side;
  b) metallizing the LTCC-M substrate as required to permit soldering thereto of the various components;
  c) attaching surface mounted devices to the LTCC-M substrates, and
  d) assembling the TEC with the first and second LTCC-M substrates and the Bi2Te3 plates by soldering the plates to metallized pads on the multilayer ceramic layers,
  e) attaching the heat sink to the bottom side of the second LTCC-M substrate,
  f) assembling the laser device and the fiber optic components to the top side of the first LTCC-M substrate,
  g) aligning the optical fiber to the laser, and
  h) attaching a lid to the top of the first LTCC-M substrate with a hermetic seal.

The other embodiments can be made in like manner using the LTCC-M technology.

The above integrated packages provides integration of optical, electrical and cooling functions in a single package, providing a compact package which is reliable and has excellent overall performance; the use of LTCC-M technology enables the incorporation of embedded circuitry for operating a laser, the TEC plates, including power supply circuitry, an embedded resistor for temperature control of the laser, adding to its overall reliability and performance. The use of a low TCE LTCC-M material minimizes stresses across the cooler which result from the temperature difference between the hot and cold faces of the substrate, further improving reliability of the package.

The overall design can be readily customized to add additional electronic devices and circuitry as will be apparent to one skilled in the art.

Although the invention has been described in terms of certain components and number of metal support substrates, it will be apparent to one skilled in the art that the metal support board used in LTCC-M technology can be used as a heat sink or can attach to additional heat sinking devices wherever they are needed to control temperature and reduce hot spots in an integrated package.

The invention is not meant to be limited to the details described above, but only by the scope of the appended claims.

We claim:

1. A low temperature cofired ceramic-metal (LTCC-M) system integrated package comprising:
    at least one ceramic circuit board, the circuit board having one or more conductive traces,
    at least one electronic component mounted on the ceramic circuit board, the electronic component electrically connected to one or more of the conductive traces;
    a first metal substrate supporting the ceramic circuit board, the circuit board bonded to the metal substrate with a bonding material; and
    a second metal substrate thermally connected to the first metal substrate via thermoelectric plates, wherein the thermoelectric plates regulate and control the temperature of the electronic component.

2. An integrated package according to claim 1 further comprising a flip chip electrically connected to the ceramic circuit board.

3. An integrated package according to claim 2 wherein a flexible circuit is bonded to the flip chip and to the ceramic circuit board.

4. An integrated package according to claim 2 wherein the ceramic circuit board and the flip chip each has a metallization pattern to receive an array of solder balls.

5. An integrated package according to claim 1 wherein a lid is hermetically sealed over the electronic component.

6. An integrated package according to claim 1 wherein the metal substrate is selected from the group consisting of Kovar®, molybdenum, copper/tungsten composite, AlSiC, Al-graphite composite and Cu-graphite composite.

7. An integrated package according to claim 1 wherein the electronic component is a semiconductor laser.

8. An integrated package according to claim 7 further comprising an optical wave guide, optically coupled to the semiconductor laster, the optical waveguide supported within the integrated package.

* * * * *